United States Patent
Jackson et al.

(10) Patent No.: US 8,425,629 B2
(45) Date of Patent: Apr. 23, 2013

(54) ALKYLATED HYDROXYAROMATIC COMPOUND FROM CONVENTIONAL AND HIGH VINYLIDENE POLYISOBUTYLENES AND COMPOSITIONS AND PROCESSES THEREOF

(75) Inventors: Mitchell M. Jackson, Chagrin Falls, OH (US); Jeffry G. Dietz, Shaker Hts., OH (US); Mark Davies, Belper (GB)

(73) Assignee: The Lubrizol Corporation, Wickliffe, OH (US)

( * ) Notice: Subject to any disclaimer, the term of this patent is extended or adjusted under 35 U.S.C. 154(b) by 1039 days.

(21) Appl. No.: 10/595,638

(22) PCT Filed: Nov. 3, 2004

(86) PCT No.: PCT/US2004/036671
§ 371 (c)(1),
(2), (4) Date: Oct. 19, 2006

(87) PCT Pub. No.: WO2005/047348
PCT Pub. Date: May 26, 2005

(65) Prior Publication Data
US 2007/0068070 A1    Mar. 29, 2007

Related U.S. Application Data

(60) Provisional application No. 60/517,195, filed on Nov. 4, 2003.

(51) Int. Cl.
*C10L 1/22* (2006.01)
*C10L 1/18* (2006.01)
*C10L 1/16* (2006.01)

(52) U.S. Cl.
USPC .................. 44/415; 44/425; 44/443; 44/459

(58) Field of Classification Search ............ 44/415, 44/432, 443, 330, 385, 459, 425; 560/355, 560/359; 568/790, 791; 564/305
See application file for complete search history.

(56) References Cited

U.S. PATENT DOCUMENTS

| 5,300,701 A | 4/1994 | Cherpeck ............... 568/792 |
| 5,663,457 A * | 9/1997 | Kolp .................... 568/790 |
| 5,725,612 A * | 3/1998 | Malfer et al. ........... 44/415 |
| 2003/0172582 A1* | 9/2003 | Carabell et al. ........... 44/330 |

FOREIGN PATENT DOCUMENTS

| DE | 19948111 A1 | 4/2001 |
| EP | 0870819 A2 | 10/1998 |

OTHER PUBLICATIONS

Corresponding PCT Publication No. WO2005/047348 & Search Report published May 26, 2005.

* cited by examiner

*Primary Examiner* — James Goloboy
*Assistant Examiner* — Latosha Hines
(74) *Attorney, Agent, or Firm* — Christopher D. Hilker; Christopher P. Demas

(57) ABSTRACT

An additive composition comprises a Mannich reaction product of a) a polyisobutylene (PIB) alkylated hydroxyaromatic compound, b) an aldehyde, and c) an amine containing at least one reactive amino group where the PIB is derived from a conventional PIB and a high vinylidene PIB. A fuel additive concentrate composition, a fuel composition, and a method to reduce deposit formation in a fuel system of an internal combustion engine employ the additive composition that comprises the Mannich reaction product which is unexpectedly effective in reducing deposits. A PIB alkylated hydroxyaromatic compound, that is prepared from a mixture of high vinylidene and conventional PIBs, is both a functional additive and an intermediate to a functional additive and the process to prepare it involves running the alkylation reaction at 5 to 40° C.

17 Claims, 4 Drawing Sheets

Figure 1a TGA analysis in nitrogen (thermal stability)
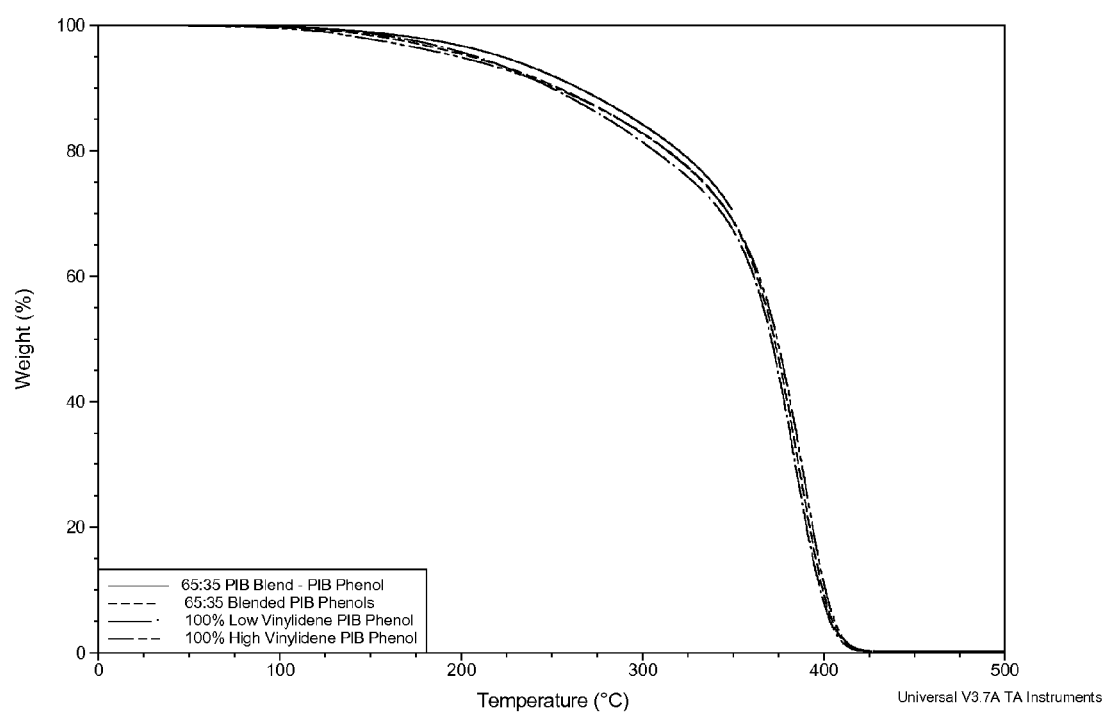

Figure 1b Expanded TGA analysis in nitrogen (thermal stability)
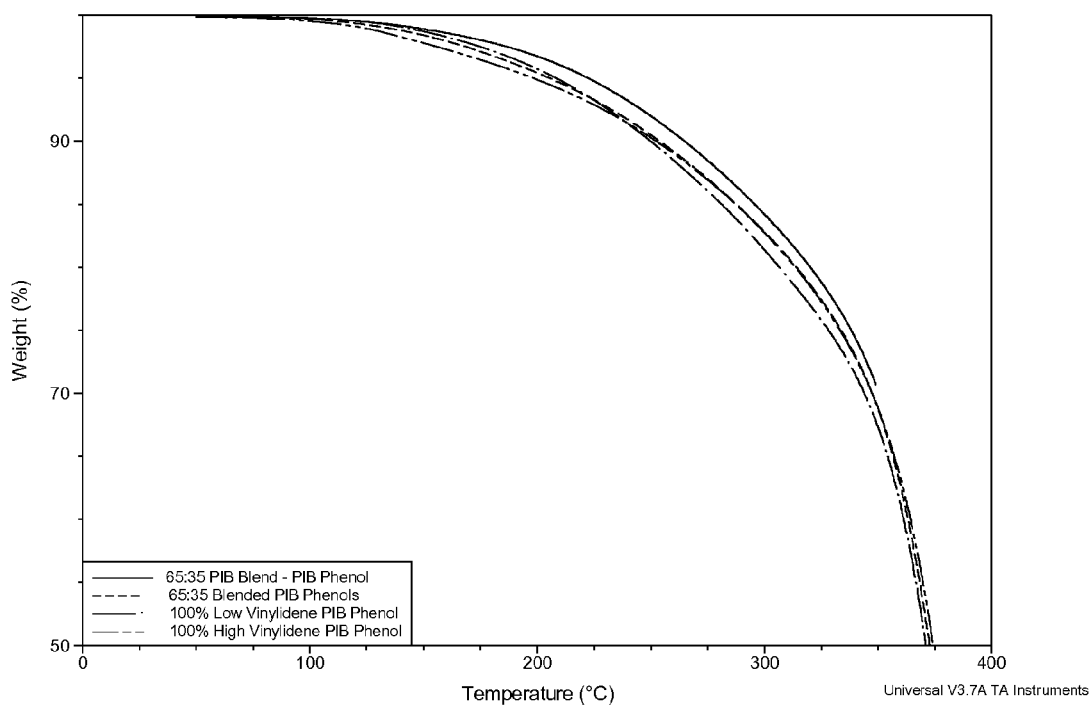

Figure 2a TGA analysis in air (oxidative stability)
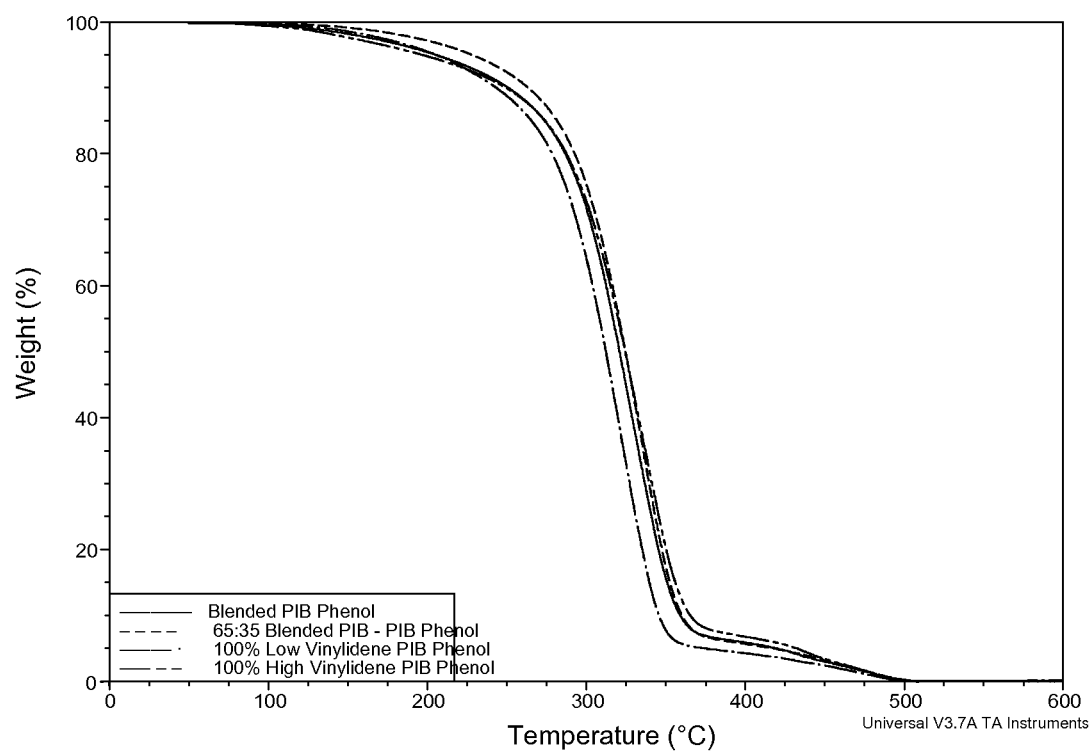

Figure 2b Expanded TGA analysis in air (oxidative stability)
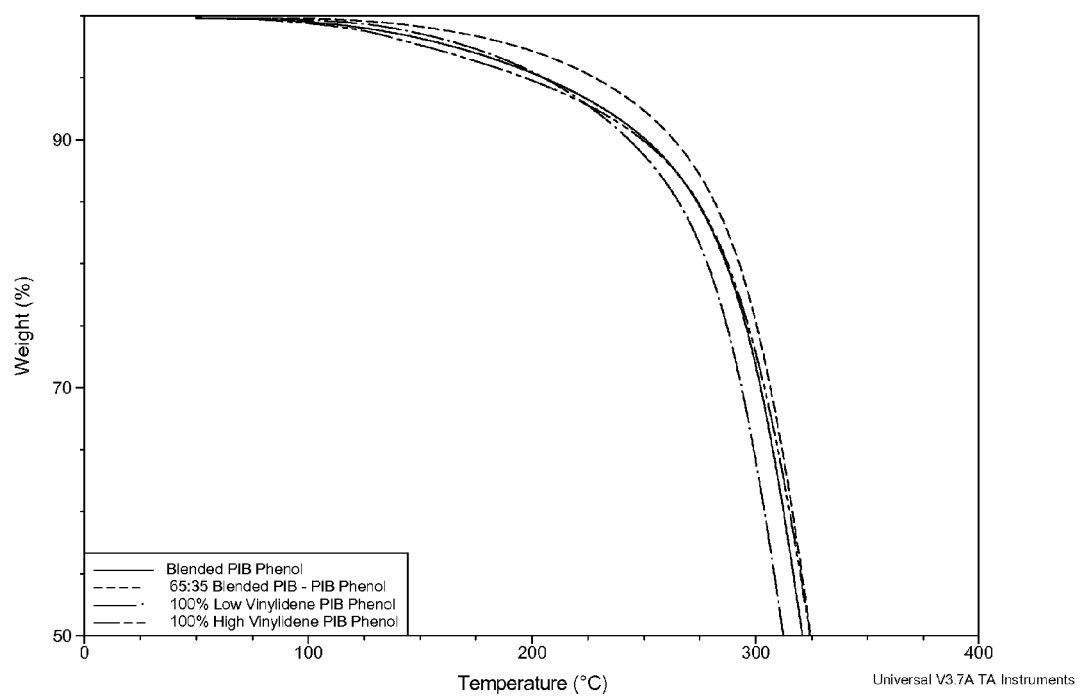

ALKYLATED HYDROXYAROMATIC COMPOUND FROM CONVENTIONAL AND HIGH VINYLIDENE POLYISOBUTYLENES AND COMPOSITIONS AND PROCESSES THEREOF

CROSS-REFERENCE TO RELATED APPLICATIONS

This application claims priority from U.S. Provisional Application No. 60/517,195 filed 4 Nov. 2003.

BACKGROUND OF THE INVENTION

1. Field of the Invention

The present invention involves an alkylated hydroxyaromatic compound, derived from a conventional polyisobutylene and a high vinylidene polyisobutylene, and a process to prepare the alkylated hydroxyaromatic compound. Additive, concentrate and fuel compositions as well as a method that effectively reduces deposit formation in a fuel system of an internal combustion engine comprise a Mannich reaction product that is prepared from the alkylated hydroxyaromatic compound.

2. Description of the Related Art

Both conventional polyisobutylene and high vinylidene polyisobutylene are available commercially as a starting material to alkylate hydroxyaromatic compounds such as phenols. The alkylated hydroxyaromatic compounds can be used as functional additives and as intermediates to functional additives for various applications. Conventional polyisobutylenes are generally prepared by polymerizing isobutylene or an isobutylene containing composition, such as a $C_4$ hydrocarbon stream from a petroleum catalytic cracker, with an active acidic polymerization catalyst such as $AlCl_3$. The resulting conventional polyisobutylene (PIB) can contain mainly about 60 to 70 mole % of a trisubstituted double bond isomer ($—CH_2C(CH_3)=CHCH_3$) and lesser amounts of about 20 to 25 mole % of a tetrasubstituted double bond isomer ($—CH(CH_3)—C(CH_3)=C(CH_3)_2$) and about 5 to 20 mole % of alpha- and/or beta-vinylidene double bond isomers. High vinylidene polyisobutylenes are usually prepared by polymerizing isobutylene or an isobutylene containing composition with a milder acidic polymerization catalyst such as $BF_3$. The resulting high vinylidene PIB can contain about 90 mole % or greater of alpha- and/or beta-vinylidene double bond isomers (respectively $—CH_2C(CH_3)=CH_2$ and/or $—CH=C(CH_3)_2$) and a minor amount of other isomers including about 1 to 10 mole % of a tetrasubstituted double bond isomer. High vinylidene PIBs because of their double bond makeup are generally thought to be more reactive and to provide derivatives such as alkylated phenols and derivatives of alkylated phenols that are more effective as functional additives when compared to conventional PIBs and derivatives thereof.

Cherpeck in European Publication No. EP 628022B1 discloses a process for alkylating a hydroxyaromatic compound with a PIB having a methylvinylidene isomer content of at least 70%.

Kolp in U.S. Pat. No. 5,663,457 discloses that conventional low vinylidene polyolefins are condensed with hydroxyaromatics under influence of macroreticular ion exchange resins in acid form to yield alkylated hydroxyaromatics.

Moreton in U.S. Pat. No. 5,876,468 discloses a Mannich reaction product that shows good detergency performance in hydrocarbon fuels where the Mannich reaction product is prepared from a PIB-substituted phenol, an aldehyde and ethylenediamine where the PIB has at least 70% vinylidene double bond isomer.

Lange et al. in International Publication No. WO 01/25294A1 disclose a method for producing a Mannich adduct from a phenol that is alkylated with a PIB having more than 70 mole % vinylidene double bonds as well as compositions and uses that employ the Mannich adduct.

Lange et al. in International Publication No. WO 02/26840A2 disclose a method for producing polyisobutenylphenols from a polyisobutylene containing at least 35 mole % of a double bond in the position beta.

It has now been found that a derivative of an alkylated hydroxyaromatic compound derived from a conventional PIB and a high vinylidene PIB is unexpectedly equally effective to more effective as a fuel additive than a derivative of an alkylated hydroxyaromatic compound derived from a high vinylidene PIB. This discovery is advantageous in that it provides fuel marketers with a new high performance fuel additive and that it provides manufacturers of conventional PIB with a new use for their product. Additional advantages of an alkylated hydroxyaromatic compound and derivatives thereof derived from a conventional PIB, usually prepared from a chlorine containing catalyst, and a high vinylidene PIB are reduced raw material cost due to the less expensive conventional PIB and alkylates and derivatives thereof that can meet low chlorine requirements.

SUMMARY OF THE INVENTION

An object of the present invention is to provide a detergent that is effective in reducing deposit formation in a fuel system of an internal combustion engine. Another object of this invention is to provide a Mannich reaction product that is effective in reducing deposit formation in a fuel system of a spark-ignited internal combustion engine.

A further object of the invention is to provide a polyisobutylene alkylated hydroxyaromatic compound that is useful as a functional additive.

A still further object of the present invention is to provide a polyisobutylene alkylated hydroxyaromatic compound that is useful as an intermediate to functional additives.

Additional objects and advantages of the present invention will be set forth in the Detailed Description which follows and, in part, will be obvious from the Detailed Description or may be learned by the practice of the invention. The objects and advantages of the invention may be realized by means of the instrumentalities and combinations pointed out in the appended claims.

To achieve the foregoing objects in accordance with the present invention as described and claimed herein, an additive composition comprises a Mannich reaction product of a) a polyisobutylene alkylated hydroxyaromatic compound, b) an aldehyde, and c) an amine containing at least one reactive amino group where the said polyisobutylene is derived from a conventional polyisobutylene and a high vinylidene polyisobutylene.

In an embodiment of the invention the above described Mannich reaction product is derived by a) mixing conventional and high vinylidene PIBs and alkylating a hydroxyaromatic compound with the mixture of PIBs followed by further derivatization to a Mannich product, or b) by mixing a hydroxyaromatic compound alkylated with a conventional PIB and a hydroxyaromatic compound alkylated with a high vinylidene PIB followed by further derivatization of the mixture to a Mannich reaction product, or c) by derivatizing each of the alkylated hydroxyaromatic compounds of b) to a Mannich reaction product and then mixing these Mannich reaction products.

In another embodiment of this invention a fuel additive concentrate composition for an internal combustion engine comprises a solvent, the above described additive composition comprising the Mannich reaction product and optionally one or more additional fuel additives.

In a further embodiment of the invention a fuel composition for an internal combustion engine comprises a major amount of a fuel and a minor amount of the above described additive composition comprising a Mannich reaction product or a minor amount of the above described fuel additive concentrate composition that comprises a solvent, an additive composition, and optionally one or more additional fuel additives.

In yet another embodiment of this invention a method to reduce deposit formation in a fuel system of an internal combustion engine comprises operating the engine with the above described fuel composition.

In still a further embodiment of the invention the above described PIB alkylated hydroxyaromatic compound, which can be used to form the Mannich reaction product of the invention and which is derived by combining the conventional PIB and the high vinylidene PIB prior to the alkylation of the hydroxyaromatic compound, is a functional additive and/or an intermediate to a functional additive.

An embodiment of the present invention is a process to prepare the above described PIB alkylated hydroxyaromatic compound that comprises forming a mixture of conventional and high vinylidene PIBs and alkylating the hydroxyaromatic compound with the mixture of PIBs at 5 to 40° C. in the presence of an acidic alkylation catalyst.

BRIEF DESCRIPTION OF THE DRAWINGS

FIG. 1a is a plot of thermal gravimetric analyses run in nitrogen for several samples of PIB alkylated phenols.

FIG. 1b is an expanded plot of FIG. 1a from 0 to 50% wt. loss.

FIG. 2a is a plot of thermal gravimetric analyses run in air for several samples of PIB alkylated phenols.

FIG. 2b is an expanded plot of FIG. 2a from 0 to 50% wt. loss.

DETAILED DESCRIPTION OF THE INVENTION

The present invention comprises an additive composition that comprises a Mannich reaction product of a) a polyisobutylene alkylated hydroxyaromatic compound, b) an aldehyde, and c) an amine containing at least one reactive amino group, wherein the said polyisobutylene is derived from a conventional polyisobutylene and a high vinylidene polyisobutylene.

The polyisobutylene substituent of the PIB alkylated hydroxyaromatic compound of this invention is derived from a conventional PIB and a high vinylidene PIB. The polyisobutylene substituent can have a number average molecular weight of 300 to 5000, and in other instances of 400 to 4000, 500 to 3000, and 500 to 750 or 750 to 1500. A conventional PIB can be characterized as having a major amount of a trisubstituted double bond isomer (—$C(CH_3)_2$ $C(CH_3)$=$CHCH_3$) and minor amounts of a tetrasubstituted double bond isomer and of an alpha- and/or beta-vinylidene double bond isomer. Conventional PIBs generally can contain a) 45 mole % or greater, 50 mole % or greater, 55 mole % or greater, 45 to 85 mole %, 50 to 75 mole %, or 55 to 70 mole % of trisubstituted double bond isomer, b) 5 to 45 mole %, 10 to 35 mole %, 15 to 30 mole %, or 20 to 25 mole % of tetrasubstituted double bond isomer, c) 30 mole % or less, 25 mole % or less, 1 to 30 mole %, 2 to 30 mole %, or 5 to 25 mole % of alpha- and/or beta-vinylidene double bond isomer, and can have d) a 1.1 to 4, 1.2 to 3.5, or 1.5 to 3 polydispersity defined as the ratio of weight average molecular weight to number average molecular weight. In an embodiment of the invention the conventional PIB has a vinylidene double bond isomer content as described above that comprises the alpha-vinylidene double bond isomer. Conventional PIBs are prepared by polymerizing isobutylene or an isobutylene containing composition, such as a $C_4$ hydrocarbon stream from a petroleum catalytic cracking unit, with an active acidic polymerization catalyst such as $AlCl_3$. Conventional PIBs are available commercially under numerous trade names including Parapol® from Exxon and Lubrizol® 3104 from Lubrizol. A high vinylidene PIB can be characterized as having a major amount of an alpha- and/or beta-vinylidene double bond isomer (respectively —$CH_2C(CH_3)$=$CH_2$ and/or —$CH$=$C(CH_3)_2$) and minor amounts of other isomers including a tetrasubstituted double bond isomer. Because of their high vinylidene double bond isomer content, high vinylidene PIBs are considered to be more reactive and to undergo a higher conversion to derivatives which are better performers in comparison to derivatives from conventional PIBs. High vinylidene PIBs generally can contain a) 70 mole % or greater, 80 mole % or greater, 90 mole % or greater, 70 to 99.9 mole %, 80 to 99.5 mole %, or 85 to 99 mole % of alpha- and/or beta-vinylidene double bond isomer, b) 0.1 to 15 mole %, 0.5 to 12 mole %, or 1 to 10 mole % of tetrasubstituted double bond isomer, and can have c) a 1.1 to 3.5, 1.2 to 3, or 1.3 to 2.5 polydispersity. In an embodiment of the invention the high vinylidene PIB can have an alpha-vinylidene double bond isomer content of 75 to 95 mole % or 80 to 90 mole %, and in another embodiment the high vinylidene PIB can have an alpha-vinylidene double bond isomer content of 50 to 70 mole % or 55 to 65 mole %. High vinylidene PIBs are prepared by polymerizing isobutylene or an isobutylene containing composition with a milder acidic polymerization catalyst such as $BF_3$. High vinylidene PIBs are available commercially from several producers to include BASF and Texas Petroleum Chemicals.

The hydroxyaromatic compound of the PIB alkylated hydroxyaromatic compound of the present invention can comprise phenol, mono- or dialkyl substituted phenols where the alkyl group has 1 to 7 carbon atoms to include for example o-cresol and 2,3-dimethylphenol, polyhydroxy containing benzenes to include for example resorcinol and/or catechol and/or hydroquinone, hydroxy containing fused ring aromatic compounds to include for example 1- and 2-naphthol, and arylalkylene-substituted phenols to include for example 2-hydroxydiphenylmethane, and mixtures thereof. In an embodiment of this invention the hydroxyaromatic compound is phenol, o-cresol, or a mixture thereof.

The polyisobutylene of the PIB alkylated hydroxyaromatic compound of the present invention is derived from a conventional and a high vinylidene PIB, as described herein above, and can have a) an alpha- and/or beta-vinylidene double bond isomer content of 97 mole % or less, 85 mole % or less, 75 mole % or less, less than 70 mole %, 50 to 95 or 97 mole %, 55 to 80 mole %, 60 to 75 mole %, or 55 to 69 mole %, b) a trisubstituted double bond isomer content of 4 or 5 to 40 mole %, 10 to 30 mole %, or 15 to 25 mole %, c) a tetrasubstituted double bond isomer content of 5 to 20 mole %, 6 to 18 mole %, or 7 to 15 mole %, and can have d) a polydispersity of 1.1 to 3.8, 1.2 to 3.5, or 1.3 to 2.8. In an embodiment of the invention the PIB of the PIB alkylated hydroxyaromatic compound of this invention can generally have 50 to 95 mole % of alpha- and/or beta-vinylidene double bond isomer and 4 to 40 mole % of trisubstituted double bond isomer, and in other embodiments can have 60 to 75 or 55 to 69 mole % of alpha- and/or beta-vinylidene double bond isomer and 15 to 25 mole % of trisubstituted double bond isomer. In a further embodiment of the invention the PIB of the PIB alkylated hydroxyaromatic compound is derived from a conventional PIB and high vinylidene PIB where the weight ratio of conventional PIB to high vinylidene PIB is respectively 0.1:99.9 to 99.9:0.1, 15:85 to 60:40, or 25:75 to 40:60.

In an embodiment of the invention the PIB of the PIB alkylated hydroxyaromatic compound is derived by combining conventional and high vinylidene PIBs prior to alkylation of the hydroxyaromatic compound. In another embodiment of the invention the PIB of the PIB alkylated hydroxyaromatic compound is derived by combining a hydroxyaromatic compound alkylated with a conventional PIB and a hydroxyaromatic compound alkylated with a high vinylidene PIB. In still another embodiment of the invention the PIB of the PIB alkylated hydroxyaromatic compound is derived by combining a Mannich reaction product from a hydroxyaromatic compound that is alkylated with a conventional PIB and a Mannich reaction product from a hydroxyaromatic compound that is alkylated with a high vinylidene PIB.

A hydroxyaromatic compound of the present invention can be alkylated with a conventional PIB, a high vinylidene PIB, or a mixture thereof as described hereinabove by reacting the hydroxyaromatic compound and the PIB in the presence of an acidic alkylation catalyst.

The hydroxyaromatic compound is generally present in excess of the PIB to increase the reaction rate and conversion of the PIB to alkylate product. In an embodiment of the invention the mole ratio of PIB to hydroxyaromatic compound is 1:1-10, and in other embodiments is 1:1-5, 1:1-3.5, and 1:1-2.

The acidic alkylation catalyst is generally a Lewis acid catalyst to include inorganic acids, organic acids, inorganic salts, inorganic salt complexes, and macroreticular resin catalysts in acid form. Lewis acid catalysts can include for example sulfuric acid, trifluoromethanesulfonic acid, p-toluenesulfonic acid, $AlCl_3$, $BF_3$ diethyl etherate, $BF_3$-phenol complex (1:2), and Amberlyst® 15 and 35 from Rohm and Haas which are sulfonated polystyrene macroreticular resins in acid form. In an embodiment of the invention the acidic alkylation catalyst is a $BF_3$ etherate complex such as $BF_3$ diethyl etherate, $BF_3$-phenol complex (1:2), or a macroreticular resin catalyst in acid form such as Amberlyst® 15 and 35. The acidic alkylation catalyst can be present in the reaction based on PIB at 1 to 60 mole %, and in other instances at 4 to 55 mole %, at 8 to 50 mole %, and at 10 to 45 mole %.

The hydroxyaromatic compound can be alkylated with the PIB of the present invention at a temperature of 0 to 200° C., and in other embodiments of the invention at a temperature of 0 to 90° C., 0 to 70° C., 5 to 40° C., 20 to 40° C., and 30 to 40° C. or 25 to 35° C. Although the reaction to form a PIB alkylated hydroxyaromatic compound can be run over a wide temperature range, the reaction is generally run at lower temperatures to avoid side reactions that include fragmentation of PIB, which can lead to a lower molecular wt. alkylated hydroxyaromatic compound, and mono- and polybutylation of the hydroxyaromatic compound. In an embodiment of the invention the alkylation reaction is run at 70° C. or lower, and in other embodiments at 50° C. or lower, at 40° C. or lower, at 35° C. or lower, and at 30° C. or lower.

The alkylation reaction can be run in the presence of an inert or relatively inert diluent which can function by making the starting materials and reaction mixture readily transferable and mixable, by facilitating contact between reactants, and by acting as a heat sink to aid in the control of the reaction temperature. The diluent can be a lubricating oil, a hydrocarbon solvent, or a mixture thereof. The lubricating oil can include a mineral oil obtained from the refining of petroleum. The hydrocarbon solvent can include aromatic hydrocarbons such as toluene, xylene and higher boiling aromatic hydrocarbons, aliphatic hydrocarbons such as hexane, heptane and higher boiling aliphatic hydrocarbons, and mixtures thereof. The diluent can be present in the starting materials and in the reaction mixture in amounts sufficient to facilitate transferring, mixing, contact between reactants, and control of reaction temperature. The diluent can be present in the reaction mixture at 5 to 95% by weight, and in other instances at 10 to 65% by weight, and 10 to 30% by weight.

The reactants, catalyst and diluent, which is optional although usually present, can be combined in any way that results in formation of an alkylation product, and generally the PIB or a solution of PIB in diluent is added to a mixture of the hydroxyaromatic compound, catalyst and optionally diluent since the addition rate of the PIB can aid in controlling the reaction temperature of the alkylation reaction which is exothermic. The alkylation reaction is usually continued until greater than 75 mole % of the PIB has been converted to an alkylate product, and in other instances until greater than 80, greater than 85, or greater than 90 mole % of the PIB has been converted to an alkylate product. The alkylation reaction is normally completed by neutralizing the catalyst with an inorganic base to include metal bases such as lime or hydrated lime and ammonia usually as an aqueous solution or in the case of resin catalysts by physically removing the catalyst for example by decantation or filtration. The crude alkylation product is typically purified by a vacuum stripping or distillation to remove volatile diluent and unreacted hydroxyaromatic compound where a filtration to remove solids can be done before or after the stripping or distillation. Typical procedures for an alkylation reaction are described in U.S. Pat. No. 5,876,468 and in the preparative example hereinbelow.

The aldehyde of the Mannich reaction product of this invention can be an aliphatic or aromatic aldehyde. The aldehyde can have 1 to 10 carbon atoms. The aldehyde can include for example formaldehyde, acetaldehyde, propionaldehyde, butyraldehyde, valeraldehyde, benzaldehyde, and decanal. In an embodiment of the invention the aldehyde is formaldehyde or a reactive equivalent thereof to include trioxane, paraformaldehyde, and formalin.

The amine of the Mannich reaction product of the present invention contains at least one reactive amino group that is capable of reacting with an aldehyde and a PIB alkylated hydroxyaromatic compound to form a Mannich reaction product. The amine can be a monoamine or a polyamine. The monoamine can be a primary amine or a secondary amine. The monoamine can have 0 to 22 carbon atoms. The monoamine can be linear and/or branched and/or cyclic, aliphatic and/or aromatic, and saturated and/or unsaturated. The monoamine can be an alkanolamine containing 1 or more hydroxyl groups. Monoamines can include for example ammonia, isopropylamine, butylamine, cyclohexylamine, oleylamine, octadecylamine, aniline, ethanolamine, dimethylamine, diisopropylamine, morpholine, and diethanolamine. In an embodiment of the invention the amine is a secondary monoamine to include for example dimethylamine, diethylamine, or diethanolamine. The polyamine has 2 or more amino groups. The amino groups of the polyamine can be primary and/or secondary and/or tertiary provided that at least one of the amino groups is primary or secondary. The polyamine can have 2 or more carbon atoms. The polyamine can be linear and/or branched and/or cyclic, aliphatic and/or aromatic, and saturated and/or unsaturated. The polyamine can be an alkanolamine containing 1 or more hydroxyl groups. Polyamines can include for example alkylenediamines such as ethylenediamine and propylenediamine and N,N-dimethylethylenediamine and N,N'-diethylpropylenediamine and N,N,N'-trimethylethylenediamine, polyethylenepolyamines such as diethylenetriamine and polyethylenepolyamine bottoms, 4-(3-aminopropyl)morpholine, and 2-(2-aminoethylamino)ethanol. In an embodiment of the invention the amine is an alkylenediamine to include for example ethylenediamine and 2-(2-aminoethylamino)ethanol. In a further embodiment of the invention the amine is a secondary monoamine, an alkylenediamine, or a mixture thereof.

The Mannich reaction product of the present invention can be prepared from the PIB alkylated hydroxyaromatic compound, aldehyde and amine as described hereinabove. The mole ratio of the alkylated hydroxyaromatic compound to aldehyde to amine for the Mannich reaction can be 0.5-1:0.5-1:0.5-1, and in other instances can be 0.7-1:0.7-1:0.7-1, and 0.9-1:0.9-1:0.9-1. The reactants can be combined in any sequence that results in formation of a Mannich reaction product. In an embodiment of the invention the amine is added to a mixture of the alkylated hydroxyaromatic compound and aldehyde. A diluent, as described above for the alkylation reaction of the hydroxyaromatic compound and PIB, can be present during the reaction to form a Mannich reaction product. In an embodiment of the invention the diluent is a high boiling aliphatic kerosene or a high boiling aromatic naphtha or toluene. The diluent can be present in the Mannich reaction mixture and Mannich reaction product at 5 to 95% by weight, and in other instances at 10 to 70% by weight, and 15 to 45% by weight. The Mannich reaction can be run at 50 to 200° C., and in other instances at 70 to 175° C., and at 90 to 150° C. Procedures to prepare a Mannich reaction product are well known and include the procedures described in U.S. Pat. No. 5,876,468 and in the preparative example hereinbelow.

The additive composition of the present invention comprises a Mannich reaction product. Depending on the application or utility of the additive composition, the additive composition can further comprise one or more additional components. An additive composition for use in a lubricant can further comprise a diluent and/or one or more performance additives. The diluent can be a lubricating oil, a solvent, or a mixture thereof. The lubricating oil can be a mineral oil from refining of petroleum, a synthetic oil to include a poly(alpha-olefin) or an ester of a carboxylic acid, or a mixture thereof. The solvent can be an aliphatic hydrocarbon, an aromatic hydrocarbon, an oxygen containing compound to include an alcohol, water, or a mixture thereof. Performance additives for a lubricant can include metal containing detergents, nitrogen containing dispersants, wear and oxidation and corrosion inhibitors, and various surfactants. An additive composition for use in a fuel can further comprise a diluent and/or one or more performance additives as described hereinbelow for a fuel additive concentrate composition.

A fuel additive concentrate composition of the present invention for an internal combustion engine comprises a solvent, the additive composition comprising the Mannich reaction product of this invention, and optionally one or more additional fuel additives. The solvent and optional fuel additive or additives that are present in the concentrate composition will largely depend on the type of internal combustion engine that the concentrate composition is to be used in. The solvent can be an aliphatic hydrocarbon, an aromatic hydrocarbon, a glycol ether, an alcohol, or a mixture thereof. The solvent for example can include an aromatic naphtha, an aliphatic kerosene, toluene, xylenes, aliphatic alcohols having 1 to 10 carbon atoms, and mixtures thereof. The solvent is normally present in the concentrate composition in an amount to provide a concentrate composition that is homogeneous and sufficiently fluid for transferring and handling. The solvent can be present in the concentrate composition at 5 to 90% by weight, and in other instances at 10 to 70% by weight, and at 15 to 50% by weight. Additional fuel additives commonly used in gasoline fuel compositions can include an anti-knock additive such as lead and cyclopentadienyl manganese tricarbonyl compounds and a valve seat recession additive such as alkali metal sulfosuccinate salts. Additional fuel additives commonly used in diesel fuel compositions can include a cetane improver such as organic nitrate and nitrite compounds, a cold flow improver such as ethylene-vinyl acetate copolymers, smoke suppressants, and antifoaming agents such as silicone fluids. Additional fuel additives commonly used in both diesel and gasoline fuel compositions can include antioxidants such as hindered phenols, supplemental detergents such as succinimides and hydrocarbyl substituted amines and polyetheramines, corrosion inhibitors such as alkenylsuccinic acids, antistatic agents, biocides, demulsifiers, fluidizers such as mineral oils and polyethers and polyetheramines, and lubricity agents such as tall oil fatty acids. Fuel additives will generally be present in a concentrate composition and fuel composition in an amount that improves performance based on several factors to include engine type, type of engine service conditions, and fuel quality. The Mannich reaction product of the present invention can be present in the concentrate composition at 5 to 90% by weight, and in other instances at 7 to 70% by weight, and at 9 to 50% by weight. The additional fuel additive or additives can each be present in the concentrate composition depending on its or their function at 0.01 to 90% by weight, and in other instances at 0.01 to 70% by weight, and at 0.01 to 50% by weight.

A fuel composition of the present invention for an internal combustion engine comprises a major amount of a fuel and a minor amount of the above described additive composition that comprises the Mannich reaction product of this invention. In another embodiment of this invention a fuel composition for an internal combustion engine comprises a major amount of a fuel and a minor amount of the above described fuel additive concentrate composition that comprises solvent, additive composition comprising the Mannich reaction product of the invention, and optionally one or more additional fuel additives. The fuel can be a normally liquid fuel. The normally liquid fuel can be a hydrocarbon fuel, a nonhydrocarbon fuel, or a mixture thereof. The hydrocarbon fuel can be a petroleum distillate to include a gasoline as defined by ASTM specification D4814 or a diesel fuel as defined by ASTM specification D975. The hydrocarbon fuel can be a hydrocarbon prepared by a gas to liquid process to include for example hydrocarbons prepared by a process such as a Fischer-Tropsch Process. The nonhydrocarbon fuel can be an oxygen-containing composition, often referred to as an oxygenate, to include alcohols, ethers, ketones, esters of carboxylic acids, nitroalkanes, and mixtures thereof. The nonhydrocarbon fuel for example can include methanol, ethanol, methyl t-butyl ether, nitromethane, and transesterified oils from plants and animals such as rapeseed methyl ester and soybean methyl ester. Mixtures of hydrocarbon and nonhydrocarbon fuels can include gasoline and methanol and/or ethanol, diesel fuel and ethanol, and diesel fuel and a transesterified plant oil such as rapeseed methyl ester. In an embodiment of the invention the fuel is an emulsion of water in a hydrocarbon fuel, a nonhydrocarbon fuel, or a mixture thereof. The Mannich reaction product of the present invention can be present in the fuel composition at 10 to 1,000 ppm (parts per million) by weight, and in other instances can be present at 50 to 800 ppm by wt., 65 to 700 ppm by wt., 80 to 500 ppm by wt., and 90 to 250 ppm by wt. Each of the additional fuel additives can be present in the fuel composition depending on their function at 0.01 to 10,000 ppm by wt., and in other instances at 0.01 to 5,000 ppm by wt., and at 0.01 to 1,000 ppm by wt.

The above described fuel additive concentrate composition and fuel composition of the present invention can be prepared by admixing or mixing the components of the composition at ambient to elevated temperatures generally up to 60° C. until the composition is homogeneous.

A method of the present invention to reduce deposit formation in a fuel system of an internal combustion engine comprises operating the engine with the above described fuel composition comprising an additive composition that comprises the Mannich reaction product of the invention. In another embodiment of the invention the method to reduce deposit formation in the fuel system of an internal combustion engine comprises operating the engine with the above described fuel composition comprising a fuel additive concentrate composition that comprises solvent, additive composition comprising the Mannich reaction product of the invention, and optionally one or more additional fuel additives. The fuel composition and method of the present invention, which employ a Mannich reaction product derived from conventional and high vinylidene PIBs, are unexpectedly effective in reducing deposits in a fuel system of an internal combustion engine compared to a fuel composition that uses a Mannich reaction product derived from a high vinylidene PIB as demonstrated in the examples hereinbelow.

In an embodiment of the invention a PIB alkylated hydroxyaromatic compound, as described hereinabove and that is derived by combining the conventional and high vinylidene PIBs prior to alkylating the hydroxyaromatic compound, is a functional additive and an intermediate to a functional additive. In another embodiment of the invention the PIB alkylated hydroxyaromatic compound is a PIB alkylated phenol which is a functional additive to include a deposit control additive in fuels and an intermediate to a functional additive to include an intermediate to the Mannich reaction product of this invention for use in lubricants and fuels. PIB alkylated hydroxyaromatic compounds, such as PIB alkylated phenols, formed by alkylating the hydroxyaromatic compound with a mixture of conventional and high vinylidene PIBs have improved thermal and oxidative stability as indicated in the thermal gravimetric analysis evaluations hereinbelow compared to a conventional PIB alkylated phenol, a high vinylidene PIB alkylated phenol, or a mixture of the two alkylated phenols.

A process of the present invention to prepare the alkylated hydroxyaromatic compound as described hereinabove comprises (a) forming a mixture of the conventional PIB and the high vinylidene PIB and (b) reacting the mixture of conventional and high vinylidene PIBs with the hydroxyaromatic compound at 5 to 40° C. in the presence of an acidic alkylation catalyst. In other embodiments of the invention the mixture of PIBs and hydroxyaromatic compound are reacted at 20 to 40° C., at 25 to 35° C., and at 30° C. or lower. This mixture of the conventional and high vinylidene PIBs can have an alpha- and beta-vinylidene isomer content and a content for the combination of alpha- and beta-vinylidene isomers and trisubstituted double bond isomer as described hereinabove. In an embodiment of the invention the mixture of PIBs is reacted with a hydroxyaromatic compound that is phenol in the presence of an acidic alkylation catalyst that is $BF_3$ diethyl etherate or $BF_3$-phenol complex (1:2). The reaction of the mixture of PIBs and hydroxyaromatic compound can be run as indicated hereinabove in the description of the additive composition. The reaction is usually run with a mole ratio of PIB to hydroxyaromatic compound where the hydroxyaromatic compound is in excess, in the presence of a solvent such as toluene, by addition of the PIB to a mixture of hydroxyaromatic compound and catalyst for temperature control, and until greater than 75 mole % of the PIB is converted to an alkylate product and in other instances until greater than 80 or 85 or 90 mole % is converted to an alkylate product.

The following examples provide procedures for preparing a PIB alkylated hydroxyaromatic compound and a Mannich derivative from the alkylate, show the unexpected effectiveness of a fuel composition of the present invention in reducing deposit formation in a fuel system of an internal combustion engine, and show the improved thermal and oxidative stability of a hydroxyaromatic compound which is alkylated with a mixture of conventional and high vinylidene PIBs. The examples are not intended to and should not be used to limit the scope of the invention.

Preparation of PIB Alkylated Phenol

Melted phenol (5107 g, 54.3 moles) and toluene (1,897 g) were charged to a reactor and mixed with constant stirring at ambient temperature below 30° C. under a nitrogen purge. $BF_3$-phenol complex (1:2) (614 g, 2.4 moles) was then charged to the reactor. A solution of a high vinylidene PIB (11,140 g, 11.4 moles, containing 97.5 mole % alpha- and beta-vinylidene isomers) and a conventional PIB (6,000 g, 6 moles, containing 20 mole % vinylidene isomers and 58 mole % trisubstituted double bond isomer) in toluene (3,794 g) was charged to the reactor over 5 hours while maintaining the temperature of the reaction mixture below 30° C. The reaction mixture was held for 4 hours while maintaining the temperature below 30° C. The reaction was then quenched by charging $Ca(OH)_2$ (857 g, 11.6 moles) to the reactor. The quenched reaction mixture was filtered through diatomaceous earth. The filtrate was gradually distilled under vacuum to 205° C. to remove toluene and unreacted phenol from the PIB alkylated phenol product (15,101 g, containing 10.7% by wt. unreacted PIB per liquid chromatography analysis).

Preparation of Mannich Reaction Product from PIB Alkylated Phenol

The PIB alkylated phenol from the above preparative procedure (13,901 g, 12.7 moles) and an aromatic solvent (4,865 g) were charged to a reactor and heated to 48° C. while stirring. Formalin (1,109 g, 13.7 moles, 37 wt. % formaldehyde in water) was charged to the reactor at 48° C. Dimethylamine (1,502 g, 13.4 moles, 40 wt. % amine in water) was charged to the reactor over 2 hours at 48° C. The mixture in the reactor was heated to 99° C. to attain full reflux while removing aqueous and organic distillate via a trap. The mixture was gradually heated to 130° C. and held at 130° C. for 2 hours. The mixture was vacuum distilled at 130° C. and −1 bar to remove any remaining water. Aromatic solvent removed during reflux and vacuum distillation was recharged to the residue in the reactor, and the resultant mixture was filtered through diatomaceous earth to give the Mannich reaction product (15,266 g, 0.8% N content, 31 base number as mg equivalents of KOH per g of sample).

Gasoline Engine Intake Valve Deposit Evaluations

TABLE 1

BMW 318i Testing[a]

| Example | Mannich PIB Source | IVD, mg[h] |
|---|---|---|
| 1 (comparative)[b] | — | 163 |
| 2 (comparative) | HV[c] | 12[i] |
| 3 (comparative) | C[d] | 78 |
| 4 | 69% HV + 31% C[e] | 16.5 |
| 5 | 83% HV + 17% C[f] | 46 |
| 6 | 70% HV + 30% C[g] | 5 |

[a]Fuel compositions containing a fuel with and without a fuel additive package were run in a BMW 318i engine for 2,500 miles following ASTM procedure D5500-98 to evaluate intake valve deposit performance. The fuel was unleaded regular gasoline containing 10% ethanol. The fuel additive package delivered 72 ppm (parts per million) by weight of a Mannich reaction product and 4.5 ppm by wt. of a polyetheramine. The Mannich reaction product was prepared from a PIB(polyisobutylene) alkylated phenol, formaldehyde and dimethylamine where the PIB has a molecular wt. near 1,000.
[b]Example 1 is a comparative base line of fuel without a fuel additive package.
[c]The Mannich reaction product was prepared from a high vinylidene (HV) PIB that contained 88 mole % alpha-vinylidene isomer.
[d]The Mannich reaction product was prepared from a conventional (C) PIB that contained 11 mole % alpha- and beta-vinylidene isomers and 66 mole % trisubstituted double bond isomer.
[e]The Mannich reaction product was a mixture of a Mannich reaction product from the high vinylidene PIB of Example 2 and a Mannich reaction product from the conventional PIB of Example 3 in respectively a 69:31 wt. % ratio.
[f]The Mannich reaction product was a mixture of a Mannich reaction product from the high vinylidene PIB of Example 2 and a Mannich reaction product from the conventional PIB of Example 3 in respectively an 83:17 wt. % ratio.
[g]The Mannich reaction product was prepared from a mixture of high vinylidene PIB and conventional PIB in respectively a 70:30 wt. % ratio. The high vinylidene PIB had a no. average mol. wt. of 961 and a 97.5 mole % alpha- and beta-vinylidene isomer content. The conventional PIB had a no. average mol. wt. of 970, a 20 mole % alpha- and beta-vinylidene isomer content and a 58 mole % trisubstituted isomer content.
[h]Intake valve deposits (IVD) in milligrams.
[i]Intake valve deposit result was the average of two engine tests which gave intake valve deposits of 12.8 and 11.4 mg.

TABLE 2

M102E Testing[a]

| Example | Mannich PIB Source/Amine | IVD, mg[g] |
|---|---|---|
| 1 (comparative) | HV/DMA[b] | 63.5 (91&36)[h] |
| 2 (comparative) | C/DMA[c] | 400 (401&399)[h] |
| 3 (comparative) | HV/EDA[d] | 78 |
| 4 | 65% HV + 35% C/DMA[e] | 355 (41&30)[h] |
| 5 | 65% HV + 35% C/EDA[f] | 74 |

[a]Fuel compositions containing gasoline and a fixed dose of an additive package of a Mannich reaction product and a polyether were run in a M102E engine following the procedure of CEC-F-05-A-93. The Mannich reaction product was prepared from PIB alkylated phenol, formaldehyde and either dimethylamine or ethylenediamine where the PIB had a molecular weight near 1,000.
[b]The Mannich reaction product was prepared from high vinylidene (HV) PIB having a 97.5 mole % alpha- and beta-vinylidene isomer content and dimethylamine (DMA).
[c]The Mannich reaction product was prepared from conventional (C) PIB having a 20 mole % alpha- and beta-vinylidene isomer content and 58 mole % trisubstituted isomer content and dimethylamine.
[d]The Mannich reaction product was prepared from the high vinylidene PIB of Example 1 and ethylenediamine (EDA).
[e]The Mannich reaction product was prepared from a mixture of the high vinylidene PIB of Example 1 and the conventional PIB of Example 2 in respectively a 65:35 wt. % ratio and dimethylamine.
[f]The Mannich reaction product was prepared from a mixture of the high vinylidene PIB of Example 1 and the conventional PIB of Example 2 in respectively a 65:35 wt. % ratio and ethylenediamine.
[g]Intake valve deposits (IVD) in milligrams.
[h]Intake valve deposit result was the average of two engine tests.

Thermal Gravimetric Analysis Evaluations of PIB Alkylated Phenols

Four PIB alkylated phenols (PIB phenols) were evaluated by thermal gravimetric analysis (TGA) run in nitrogen for thermal stability and run in air for oxidative stability. The four samples were a PIB phenol from high vinylidene PIB, a PIB phenol from conventional PIB, a PIB phenol from mixing the high vinylidene PIB phenol and the conventional PIB phenol in respectively a 65:35 wt. ratio, and a PIB phenol from alkylation with a mixture of the high vinylidene PIB and the conventional PIB in respectively a 65:35 wt. ratio. In general TGA analysis indicates that materials having less weight loss over a temperature range are more stable. FIG. 1a is the TGA plot in nitrogen for thermal stability for the four PIB phenol samples from 0 to 100% wt. loss. FIG. 1b is an expanded plot of FIG. 1a from 0 to 50% wt. loss which shows that the PIB phenol (65:35 PIB Blend—PIB Phenol) from alkylation with a mixture of high vinylidene and conventional PIBs is more thermally stable than the other PIB phenols from 175 to 350° C. FIG. 2a is the TGA plot in air for oxidative stability for the four PIB phenol samples from 0 to 100% wt. loss. FIG. 2b is an expanded plot of FIG. 2a from 0 to 50% wt. loss which shows that the PIB phenol (65:35 Blended PIB—PIB Phenol) from alkylation with a mixture of high vinylidene and conventional PIBs is more oxidatively stable than the other PIB phenols from 150 to 300° C.

Each of the documents referred to in this Detailed Description of the Invention section is incorporated herein by reference. All numerical quantities in this application used to describe or claim the present invention are understood to be modified by the word "about" except for the examples or where explicitly indicated otherwise. All chemical treatments or contents throughout this application regarding the present invention are understood to be as actives unless indicated otherwise even though solvents or diluents may be present.

What is claimed is:

1. A fuel composition comprising:
   a Mannich reaction product of
   a) a polyisobutylene alkylated hydroxyaromatic compound;
   b) formaldehyde or a reactive equivalent thereof; and
   c) a secondary monoamine component comprising dimethylamine;
   wherein the said polyisobutylene alkylated hydroxyaromatic compound is derived from a combination of a conventional polyisobutylene and a high vinylidene polyisobutylene; and wherein the said polyisobutylene alkylated hydroxyaromatic compound is derived by:
   i) combining the conventional polyisobutylene and the high vinylidene polyisobutylene prior to the alkylation of the hydroxyaromatic compound; or
   ii) combining a hydroxyaromatic compound alkylated with the conventional polyisobutylene and a hydroxyaromatic compound alkylated with the high vinylidene polyisobutylene;
   wherein the ratio of conventional polyisobutylene to high vinylidene polyisobutylene is from 25:75 to 40:60 on a weight basis; and
   wherein the Mannich reaction product is present in the fuel composition from 10 to 10,000 ppm.

2. The fuel composition of claim 1 wherein the conventional polyisobutylene has a trisubstituted double bond isomer content of 45 mole % or greater.

3. The fuel composition of claim 1 wherein the high vinylidene polyisobutylene has a combined alpha- and beta-vinylidene double bond isomer content of 70 mole % or greater.

4. The fuel composition of claim 1 wherein the polyisobutylene of the alkylated hydroxyaromatic compound has an alpha- and beta-vinylidene double bond isomer content of 50 to 95 mole % and a trisubstituted double bond isomer content of 4 to 40 mole %.

5. The fuel composition of claim 1 wherein the said polyisobutylene is derived by combining the conventional polyisobutylene and the high vinylidene polyisobutylene prior to the alkylation of the hydroxyaromatic compound.

6. The fuel composition of claim 1 wherein the said polyisobutylene is derived by combining a hydroxyaromatic compound alkylated with the conventional polyisobutylene and a hydroxyaromatic compound alkylated with the high vinylidene polyisobutylene.

7. The fuel composition of claim 1 wherein the said polyisobutylene is derived by combining a Mannich reaction product from a hydroxyaromatic compound alkylated with the conventional polyisobutylene and a Mannich reaction product from a hydroxyaromatic compound alkylated with the high vinylidene polyisobutylene.

8. The fuel composition of claim 1 wherein the said polyisobutylene has a number average molecular weight ranging from 500 to 3,000.

9. The fuel composition of claim 1 wherein the hydroxyaromatic compound is phenol, the aldehyde is formaldehyde or a reactive equivalent thereof, and the amine is a secondary monoamine, an alkylenediamine, or a mixture thereof.

10. The fuel composition of claim 1 wherein said conventional polyisobutylene is derived from a process that uses an $AlCl_3$ catalyst and wherein said conventional polyisobutylene has an alpha- and/or beta-vinylidene double bond isomer content of 30 mole percent or less; and
   wherein said high vinylidene polyisobutylene is derived from a process that uses a $BF_3$ catalyst and wherein said high vinylidene polyisobutylene has an alpha- and/or beta-vinylidene double bond isomer content of 80 mole percent or more.

11. The fuel composition of claim 1 wherein the ratio of conventional polyisobutylene to high vinylidene polyisobutylene is from about 30 or 31 parts conventional polyisobutylene to about 70 or 69 parts high vinylidene polyisobutylene on a weight basis and wherein the Mannich additive is present in the fuel composition from 10 to 1,000 ppm.

12. The fuel composition of claim 10 wherein the ratio of conventional polyisobutylene to high vinylidene polyisobutylene is from about 30 or 31 parts conventional polyisobutylene to about 70 or 69 parts high vinylidene polyisobutylene on a weight basis and wherein the Mannich additive is present in the fuel composition from 10 to 1,000 ppm.

13. The fuel composition of claim 10 wherein the amine comprises a secondary monoamine containing from 0 to 22 carbon atoms, an alkylenediamine containing more than 2 carbon atoms, or a mixture thereof; and wherein the aldehyde comprises a aliphatic aldehyde.

14. The fuel composition of claim 11 wherein the amine comprises a secondary monoamine containing from 0 to 22 carbon atoms, an alkylenediamine containing more than 2 carbon atoms, or a mixture thereof; and wherein the aldehyde comprises a aliphatic aldehyde.

15. The fuel composition of claim 12 wherein the amine comprises a secondary monoamine containing from 0 to 22 carbon atoms, an alkylenediamine containing more than 2 carbon atoms, or a mixture thereof; and wherein the aldehyde comprises a aliphatic aldehyde.

16. The fuel composition of claim 11 wherein the amine comprises dimethyl-amine or ethylenediamine.

17. The fuel composition of claim 12 wherein the amine comprises dimethyl-amine or ethylenediamine.

\* \* \* \* \*